US012672352B2

(12) United States Patent
Kim et al.

(10) Patent No.: US 12,672,352 B2
(45) Date of Patent: Jun. 30, 2026

(54) STRETCHABLE DISPLAY DEVICE

(71) Applicant: LG Display Co., Ltd., Seoul (KR)

(72) Inventors: Tae-Hyun Kim, Paju-si (KR);
Sung-Joon Min, Paju-si (KR);
Yeon-Jun Oh, Paju-si (KR); Do-Joong Kim, Paju-si (KR); Jun-Hyuk Song,
Paju-si (KR)

(73) Assignee: LG Display Co., Ltd., Seoul (KR)

( * ) Notice: Subject to any disclaimer, the term of this
patent is extended or adjusted under 35
U.S.C. 154(b) by 0 days.

(21) Appl. No.: 18/887,809

(22) Filed: Sep. 17, 2024

(65) Prior Publication Data

US 2025/0267944 A1    Aug. 21, 2025

(30) Foreign Application Priority Data

Feb. 19, 2024    (KR) ........................ 10-2024-0023267

(51) Int. Cl.
| | |
|---|---|
| *H10D 86/60* | (2025.01) |
| *G06F 3/041* | (2006.01) |
| *G06F 3/044* | (2006.01) |
| *H10D 86/40* | (2025.01) |
| *H10W 90/00* | (2026.01) |

(52) U.S. Cl.
CPC ........... *H10D 86/60* (2025.01); *G06F 3/0412*
(2013.01); *G06F 3/0445* (2019.05); *G06F
3/0446* (2019.05); *G06F 3/0448* (2019.05);
*H10D 86/441* (2025.01); *H10W 90/00*
(2026.01); *G06F 2203/04102* (2013.01)

(58) Field of Classification Search
CPC .... G06F 3/0445; G06F 3/0446; G06F 3/0412;
G06F 3/0448; G06F 2203/04102; H10D
86/60; H10D 86/441; H01L 25/167
See application file for complete search history.

(56) References Cited

U.S. PATENT DOCUMENTS

| | | | |
|---|---|---|---|
| 11,270,607 B2 | 3/2022 | Jung et al. | |
| 11,462,157 B2 | 10/2022 | Ahn et al. | |
| 2021/0134191 A1* | 5/2021 | Jung | .................... H10H 20/857 |

FOREIGN PATENT DOCUMENTS

| | | |
|---|---|---|
| KR | 20200081945 A | 7/2020 |
| KR | 20210054323 A | 5/2021 |

* cited by examiner

*Primary Examiner* — Lisa S Landis
(74) *Attorney, Agent, or Firm* — Seed Intellectual
Property Law Group LLP

(57) ABSTRACT

A stretchable display device includes a plurality of rigid
portions spaced apart from each other in a first direction and
a second direction transverse to the first direction. The
stretchable display device includes a soft portion provided
between adjacent rigid portions in the first direction or the
second direction. The stretchable display device includes a
sensing portion provided between adjacent soft portions in
the first direction or the second direction. The stretchable
display device includes a pixel provided in each of the
plurality of rigid portions and including a plurality of
sub-pixels. The stretchable display device includes a stretch-
able line provided in the soft portion and connecting adja-
cent pixels. The stretchable display device includes a sens-
ing capacitor and a sensing line provided in the sensing
portion.

24 Claims, 7 Drawing Sheets

STRETCHABLE DISPLAY DEVICE

CROSS-REFERENCE TO RELATED APPLICATION

The present application claims priority to Korean Patent Application No. 10-2024-0023267 filed in the Republic of Korea on Feb. 19, 2024, the entire contents of which are hereby expressly incorporated by reference into the present application.

BACKGROUND

Technical Field

The present disclosure relates to a display device, and more particularly, to a stretchable display device.

Description of the Related Art

As the information society progresses, interest in displays that process and display a large amount of information has been increasing, and various types of displays have been developed.

Accordingly, in addition to a commonly known rectangular display, flexible display devices such as a bendable display device for gaming, a foldable display device capable of being folded and unfolded, and a rollable display device having optimal space utilization have been widely developed.

Recently, a stretchable display device, which is much more flexible than these flexible display devices, has been in the spotlight as a next-generation display.

The stretchable display device is a display that can freely transform the shape of a screen without distortion even when the size of the screen is increased, folded, or twisted. Unlike the bendable, foldable, or rollable display devices that can only be transformed in a specific area or direction, the stretchable display device is able to implement the ultimate free-form and is considered as the most suitable display for the era of the Internet of Things (IoT), 5G, and autonomous vehicles.

The stretchable display device may include a rigid portion in which a pixel is disposed and a soft portion in which a connection line connecting the pixels is disposed. The rigid portion may not be stretched, and the soft portion may be stretched.

Meanwhile, the stretchable display device may include touch performance. To do this, a touch panel for receiving the user's command may be attached onto a display panel including the rigid portion and the soft portion and displaying an image.

BRIEF SUMMARY

When the stretchable display device including the touch panel is stretched, a transmitter line and a receiver line constituting a touch sensor are stretched, and a distance therebetween is changed, resulting in a change in capacitance. Accordingly, the inventors of the present disclosure have recognized that noise occurs in the touch sensor and the accuracy of touch sensing decreases.

In addition, since the touch panel is manufactured on a separate substrate and attached to the display pane, when the stretching degree of the touch panel does not match the stretching degree of the display panel, there is a problem that the accuracy of touch sensing in which the touch position does not match the position of the display panel decreases, and the stretchable display device including the touch panel also has disadvantages of relatively thick thickness and increasing costs.

Further, since an additional panel is attached to the display panel, transmittance decreases, and depending on the shape of the touch panel, a Moire pattern may occur when emitting light, reducing visibility. The inventors of the present disclosure have provided various embodiments to address the various technical problems in the related art, including the problems identified above.

Accordingly, the present disclosure provides a stretchable display device that substantially obviates one or more of the limitations and disadvantages described above and associated with the background art.

More specifically, various embodiments of the present disclosure provide a stretchable display device with improved touch performance and accuracy.

Various embodiments of the present disclosure provide a stretchable display device having a relatively thin thickness and capable of reducing manufacturing costs.

Various embodiments of the present disclosure provide a stretchable display device with improved transmittance and visibility.

Additional features and aspects will be set forth in the description that follows, and in part will be apparent from the description, or can be learned by practice of the present disclosure provided herein. Other features and aspects of the inventive concepts can be realized and attained by the structure particularly pointed out in the written description, or derivable therefrom, and the claims hereof as well as the appended drawings.

To achieve these and other aspects of the present disclosure, as embodied and broadly described herein, a stretchable display device includes a plurality of rigid portions spaced apart from each other in a first direction and a second direction; a soft portion provided between adjacent rigid portions in the first direction or the second direction; a sensing portion provided between adjacent soft portions in the first direction or the second direction; a pixel provided in each of the plurality of rigid portions and including a plurality of sub-pixels; a stretchable line provided in the soft portion and connecting adjacent pixels; and a sensing capacitor and a sensing line provided in the sensing portion.

A stretchable display device includes a plurality of rigid portions spaced apart from each other in a first direction and a second direction; a soft portion provided between adjacent rigid portions in the first direction or the second direction; a sub rigid portion provided between adjacent soft portions in the first direction or the second direction; a sub soft portion provided between the rigid portion and the sub rigid portion adjacent to each other in a third direction or a fourth direction crossing the first and second directions; a pixel provided in each of the plurality of rigid portions and including a plurality of sub-pixels; a stretchable line provided in the soft portion and connecting adjacent pixels; a sensing capacitor provided in the sub rigid portion; and a sensing line provided in the sub soft portion.

It is to be understood that both the foregoing general description and the following detailed description are examples and are intended to provide further explanation of the inventive concepts as claimed.

BRIEF DESCRIPTION OF THE SEVERAL VIEWS OF THE DRAWINGS

The accompanying drawings, which are included to provide a further understanding of the present disclosure and which are incorporated in and constitute a part of this application, illustrate aspects of the disclosure and together with the description serve to explain various principles of the present disclosure.

In the drawings.

DETAILED DESCRIPTION

Figure 1:
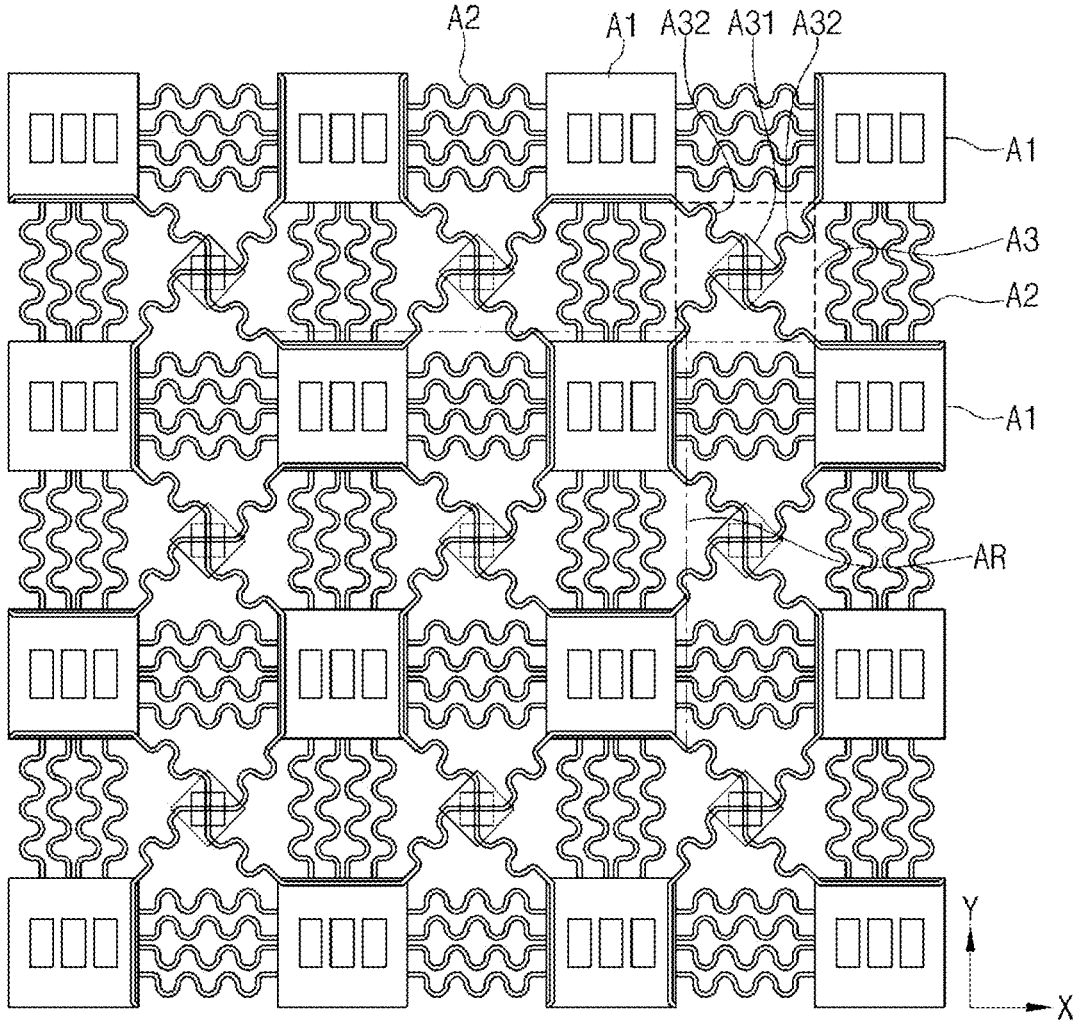
FIG. 1 is a schematic plan view of a stretchable display device according to an embodiment of the present disclosure.

Advantages and features of the present disclosure and methods for achieving them will be made clear from embodiments described in detail below with reference to the accompanying drawings. The present disclosure can, however, be implemented in many different forms and should not be construed as being limited to the embodiments set forth herein, and the embodiments are provided such that this disclosure will be thorough and complete and will fully convey the scope of the present disclosure to those skilled in the art to which the present disclosure pertains.

Shapes, sizes, dimensions (e.g., length, width, height, thickness, radius, diameter, area, etc.), ratios, angles, numbers, number of elements, and the like disclosed in the drawings for describing the embodiments of the present disclosure are merely examples, and thus the present disclosure is not limited to the illustrated matters.

A dimension including size and a thickness of each component illustrated in the drawing are illustrated for convenience of description, and the present disclosure is not limited to the size and the thickness of the component illustrated, but it is to be noted that the relative dimensions including the relative size, location, and thickness of the components illustrated in various drawings submitted herewith are part of the present disclosure.

The same reference numerals refer to the same components throughout this disclosure. Further, in the following description of the present disclosure, when a detailed description of a known related art is determined to unnecessarily obscure the gist of the present disclosure, the detailed description thereof will be omitted herein or may be briefly discussed.

When terms such as "including," "having," "comprising" and the like mentioned in this disclosure are used, other parts can be added unless the term "only" is used herein. Further, when a component is expressed as being singular, being plural is included unless otherwise specified.

In analyzing a component, an error range is interpreted as being included even when there is no explicit description.

The text "and/or" as used herein indicates that either one of the options or both options can be considered. For example, "A and/or B" means (1) Option A, or (2) Option B, or (3) Both Option A and Option B.

In describing a positional relationship, for example, when a positional relationship of two parts/layers is described as being "over," "on," "above," "below," "under," "next to," or the like, one or more other parts/layers can be provided between the two parts/layers, unless the term "immediately" or "directly" is used therewith.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

In describing a temporal relationship, for example, when a temporal predecessor relationship is described as being "after," "subsequent," "next to," "prior to," or the like, unless "immediately" or "directly" is used, cases that are not continuous or sequential can also be included.

Although the terms first, second, and the like are used to describe various components, these components are not substantially limited by these terms. These terms are used only to distinguish one component from another component, and may not define any order or sequence. Therefore, a first component described below can substantially be a second component within the technical spirit of the present disclosure.

Features of various embodiments of the present disclosure can be partially or entirely united or combined with each other, technically various interlocking and driving are possible, and each of the embodiments can be independently implemented with respect to each other or implemented together in a related relationship.

Hereinafter, an exemplary embodiment of the present disclosure will be described in detail with reference to accompanying drawings.

FIG. 1 is a schematic plan view of a stretchable display device according to an embodiment of the present disclosure and shows a display panel including a sensing portion detecting a touch input.

In FIG. 1, a stretchable display device according to an embodiment of the present disclosure may include a rigid substrate A1 (also referred to as a rigid portion A1) and a soft substrate A2 (also referred to as a soft portion A2) and may be stretched in a first direction X and/or a second direction Y. Here, the rigid portion A1 may not be stretched, and the soft portion A2 may be stretched. The term 'soft' in the soft portion indicates that the soft portion A2 is stretchable, extendable, pliable, bendable, flexible, etc. On the other hand, the term 'rigid' in the rigid portion indicates that the rigid portion A1, compared to the soft portion, is less stretchable, extendable, pliable, bendable, flexible, etc. For example, rigid portions may also be stretchable to some extent but not as much as the soft portions.

The rigid portion A1 may be provided to be plural in the form of an island, and the plurality of rigid portions A1 may be disposed to be spaced apart from each other along the first direction X and the second direction Y. The rigid portions A1 may be disposed in a matrix form (as shown from the plan view). In some embodiments, as shown in FIG. 1, the plurality of rigid portions A1 is spaced apart from each other. The rigid portions A1 are arranged along a first direction (e.g., x-axis direction) and along a second direction (e.g., y-axis direction).

For example, the rigid portion A1 may have a polygonal shape, and in some embodiments, may have a substantially rectangular shape.

A pixel including a plurality of sub-pixels may be provided in the rigid portion A1. Each of the plurality of sub-pixels may include a light-emitting diode, at least one thin film transistor, a plurality of lines, and a plurality of electrodes.

The soft portion A2 may be disposed between the rigid portions A1 adjacent to each other in the first direction X and the second direction Y. Multiple soft portions A2 may be provided between the adjacent rigid portions A1.

A stretchable line that is a connection line connecting the adjacent pixels may be provided in the soft portion A2. The stretchable line may include a plurality of signal lines such as a gate line, a data line, a high potential line, a low potential line, an emission line, and a reference voltage line, etc. The stretchable line may have at least one curved part.

In addition, the stretchable display device according to the embodiment of the present disclosure may further include a sensing portion A3. A sensing capacitor and a sensing line may be provided in the sensing portion A3.

The sensing portion A3 may be disposed between adjacent soft portions A2 in the first direction X or the second direction Y. Accordingly, the sensing portion A3 may be disposed between adjacent rigid portions A1 in a third direction or a fourth direction transverse to the first direction X and the second direction Y. Here, the third direction and the fourth direction overlap each other. Referring to FIG. 1, the sensing portions A3 are provided at locations that do not overlap with the rigid portions A1 from a plan view. Similarly, the sensing portions A3 do not overlap with the soft portions A2 extended between adjacent rigid portions A1 from a plan view. As illustrated, in some embodiments, the sensing portions A3 are located at a space where both the rigid portions A1 and the soft portions A2 are not located such that the sensing portions A3 do not overlap with both the rigid portions A1 and the soft portions A2 from a plan view.

The sensing portion A3 may include a sub rigid portion A31 and a sub soft portion A32. The sub soft portion A32 may be stretched, and the sub rigid portion A31 may also be stretched to some extent but not as much as the sub soft portion A32. That is, the sub rigid portion A31 has relatively less stretchability than the sub soft portion A32.

The sub rigid portion A31 may be provided in the form of an island and may be spaced apart from the rigid portion A1 and the soft portion A2 as shown from the plan view. The sensing capacitor may be provided in the sub rigid portion A31.

For example, the sub rigid portion A31 may have a polygonal shape and in some embodiments, the sub rigid portion A31 may substantially have a rectangular shape. That is, in some embodiments, the sub rigid portion A31 may have substantially the same shape as the rigid portion A1. An area of the sub rigid portion A31 may be smaller than an area of the rigid portion A1.

The sub soft portion A32 may be disposed between the rigid portion A1 and the sub rigid portion A31 adjacent to each other in the third direction or the fourth direction. The sensing line may be provided in the sub soft portion A32. The sensing line may have at least one curved part.

The stretchable display device including the sensing portion A3 according to the embodiment of the present disclosure will be described in detail with reference to FIG. 2.

Figure 2:
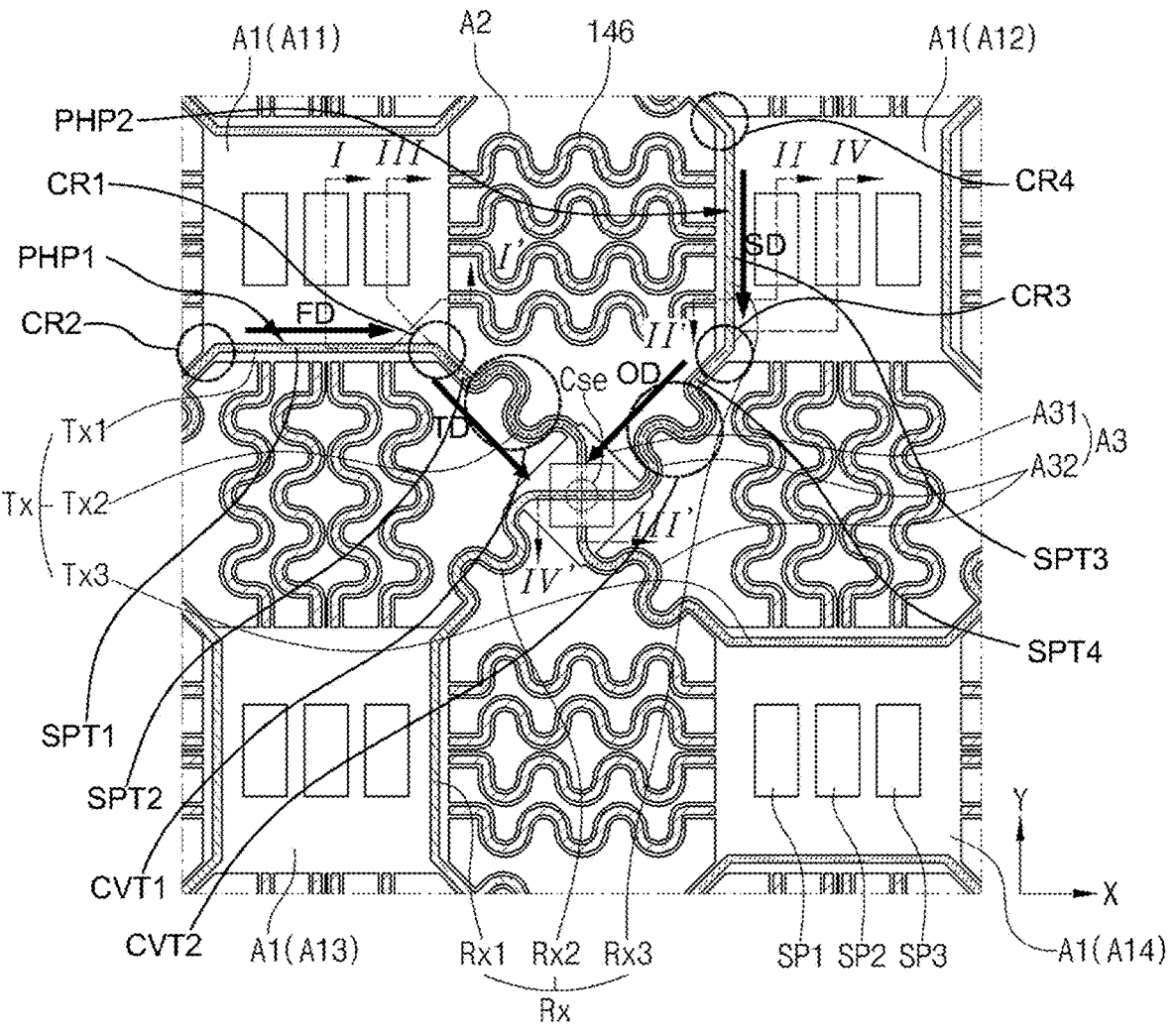
FIG. 2 is a plan view schematically enlarging a part of the stretchable display device according to the embodiment of the present disclosure.

FIG. 2 is a plan view schematically enlarging a part of the stretchable display device according to the embodiment of the present disclosure and shows the area AR of FIG. 1.

In FIG. 2, the stretchable display device according to the embodiment of the present disclosure may include the rigid portion A1, the soft portion A2, and the sensing portion A3.

The plurality of rigid portions A1 may be spaced apart from each other along the first direction X and the second direction Y and may be disposed in the matrix form. A pixel including a plurality of sub-pixels SP1, SP2, and SP3 may be provided in each rigid portion A1. For example, first, second, and third sub-pixels SP1, SP2, and SP3 may be provided in the rigid portion A1, and the first, second, and third sub-pixels SP1, SP2, and SP3 may be red, green, and blue sub-pixels, respectively.

Each of the first, second, and third sub-pixels SP1, SP2, and SP3 may include a light-emitting element, at least one thin film transistor, and at least one capacitor.

For example, four rigid portions A11, A12, A13, and A13 may be repeatedly arranged in a 2×2 matrix form. At this time, a first rigid portion A11 may be disposed in the mth row (m is a natural number) and the nth column (n is a natural number), a second rigid portion A12 may be disposed in the mth row and the (n+1)th column, a third rigid portion A13 may be disposed in the (m+1)th row and the nth column, and a fourth rigid portion A14 may be disposed in the (m+1)th row and the (n+1)th column.

The soft portion A2 may be disposed between the adjacent rigid portions A1 in the first direction X and the second direction Y. That is, the soft portions A2 may be disposed between the adjacent first and second rigid portions A11 and A12 in the first direction X, between the adjacent third and fourth rigid portions A13 and A14 in the first direction X, between the adjacent first and third rigid portions A11 and A13 in the second direction Y, and between the adjacent second and fourth rigid portions A12 and A14 in the second direction Y, respectively.

The stretchable line 146 may be provided in each soft portion A2. The stretchable line 146 may have at least one curved part. For example, the stretchable line 146 may have a wave structure and may include a plurality of wave shapes.

The sensing portion A3 may be disposed between the adjacent soft portions A2 in the first direction X or the second direction Y. Accordingly, the sensing portion A3 may be disposed between the adjacent rigid portions A1 in the third direction or the fourth direction crossing the first direction X and the second direction Y. That is, the sensing portion A3 may be disposed between the adjacent first and fourth rigid portions A11 and A14 in the third direction or may be disposed between the adjacent second and third rigid portions A12 and A13 in the fourth direction.

The sensing portion A3 may include the sub rigid portion A31 and the sub soft portion A32. The sub rigid portion A31 may be spaced apart from the rigid portion A1, and the sub soft portion A32 may be disposed between the sub rigid portion A31 and the rigid portion A1. Specifically, the sub soft portions A32 may be provided between the sub rigid portion A31 and the first rigid portion A11 in the third direction, between the sub rigid portion A31 and the fourth rigid portion A14 in the third direction, between the sub rigid portion A31 and the second rigid portion A12 in the fourth direction, and between the sub rigid portion A31 and the third rigid portion A13 in the fourth direction, respectively. The sub rigid portion A31 may be connected to four rigid portions, that is, the first, second, third, and fourth rigid portions A11, A12, A13, and A14 through the sub soft portions A32.

The sensing line Tx and Rx may be provided in the sub soft portion A32. The sensing line Tx and Rx may have at least one curved part. For example, the sensing line Tx and Rx may have a wave structure and may include a plurality of wave shapes.

The sensing line Tx and Rx may include a transmitter line Tx and a receiver line Rx and may extend into and be provided in the rigid portion A1 and the sub rigid portion A31. At this time, the transmitter line Tx and the receiver line Rx may be provided in different rigid portions A1, and one rigid portion A1 may be provided with at least one transmitter line Tx or at least one receiver line Rx.

In addition, the transmitter line Tx and the receiver line Rx may cross each other in the sub rigid portion A31 to constitute a sensing capacitor Cse. That is, the sensing capacitor Cse may include the transmitter line Tx and the receiver line Rx crossing each other. To elaborate, the sensing capacitor Cse includes a first capacitor electrode, a second capacitor electrode, and an insulation layer 116a between the first capacitor electrode and the second capacitor. Here, the transmitter line Tx is the first capacitor electrode of the sensing capacitor Cse, and the receiver line Rx is the second capacitor electrode of the sensing capacitor Cse.

In some embodiments, the transmitter line Tx and the receiver line Rx include a wave-like shape from a plan view as shown in FIGS. 1 and 2. Similarly, the stretchable lines 146 also include wave-like shape from a plan view as shown in FIGS. 1 and 2.

The transmitter line Tx may include first, second, and third transmitter parts Tx1, Tx2, and Tx3. The first, second, and third transmitter parts Tx1, Tx2, and Tx3 may be substantially sequentially disposed along the first direction X. Accordingly, the second transmitter part Tx2 may be disposed between the first and third transmitter parts Tx1 and Tx3. Here, the first and third transmitter parts Tx1 and Tx3 may extend in the first direction X, and the second transmitter part Tx2 may extend substantially in the third direction. Therefore, the transmitter line Tx may extend substantially in the first direction X.

The receiver line Rx may include first, second, and third receiver parts Rx1, Rx2, and Rx3. The first, second, and third receiver parts Rx1, Rx2, and Rx3 may be substantially sequentially disposed along the second direction Y. Accordingly, the second receiver part Rx2 may be disposed between the first and third receiver parts Rx1 and Rx3. Here, the first and third receiver parts Rx1 and Rx3 may extend in the second direction Y, and the second receiver part Rx2 may extend substantially in the fourth direction. Therefore, the receiver line Rx may extend substantially in the second direction Y.

The first and third transmitter parts Tx1 and Tx3 of the transmitter line Tx and the first and third receiver parts Rx1 and Rx3 of the receiver line Rx may be disposed in the rigid portions A1. At this time, the transmitter line Tx and the receiver line Rx may be disposed in the two adjacent rigid portions A1 in the first direction X or the second direction Y, respectively. Accordingly, the first and third transmitter parts Tx1 and Tx3 and the first and third receiver parts Rx1 and Rx3 may be disposed in different rigid portions A1.

In addition, the second transmitter part Tx2 of the transmitter line Tx and the second receiver part Rx2 of the receiver line Rx may be disposed in the sensing portion A3 and may cross and overlap each other. Accordingly, the second transmitter part Tx2 and the second receiver part Rx2 crossing each other in the sub rigid portion A31 may constitute the sensing capacitor Cse. Each of the second transmitter part Tx2 and the second receiver part Rx2 may have at least one curved part.

For example, in the case that four rigid portions A11, A12, A13, and A14 are repeatedly arranged in the 2×2 matrix form, the first transmitter part Tx1 may be disposed in the first rigid portion A11 of the mth row and the nth column, the third transmitter part Tx3 may be disposed in the fourth rigid portion A14 of the (m+1)th row and the (n+1)th column, the first receiver part Rx1 may be disposed in the third rigid portion A13 of the (m+1)th row and the nth column, and the third receiver part Rx3 may be disposed in the second rigid portion A12 of the mth row and the (n+1)th column. However, embodiments of the present disclosure are not limited thereto.

Alternatively, the first receiver part Rx1 may be disposed in the first rigid portion A11 of the mth row and the nth column, the third receiver part Rx3 may be disposed in the fourth rigid portion A14 of the (m+1)th row and the (n+1)th column, the first transmitter part Tx1 may be disposed in the third rigid portion A13 of the (m+1)th row and the nth column, and the third transmitter part Tx3 may be disposed in the second rigid portion A12 of the mth row and the (n+1)th column.

Here, two transmitter lines Tx or two receiver lines Rx may be provided in at least one rigid portion A1.

Referring to FIG. 2, a substrate A11 of the rigid portion A1 has at least two corners, namely, a first corner CR1 and a second corner CR2. The corners of the substrate can also be referred to as an edge portion. Here, a first peripheral portion PHP1 of the substrate is located between the first corner CR1 and the second corner CR2.

The transmitter line Tx includes a first straight part SPT1, a second straight part SPT2, and a curved part CVT1. As shown, the first straight part SPT1 of the transmitter line Tx is disposed along the first peripheral portion PHP1 of the substrate between the first corner CR1 and the second corner CR2. The transmitter line Tx further extends from the first corner CR1 and extends towards the sensing portion A3. The transmitter line Tx includes a second straight part SPT2 that extends from the first corner CR1. The curved part CVT1 of the transmitter line Tx is continuously and contiguously coupled to the second straight part SPT2. Similarly, the second straight part SPT2 is continuously and contiguously coupled to the first straight part SPT1.

Here, the first straight part SPT1 of the transmitter line Tx is extended in a first direction FD (namely, the x-axis direction). The second straight part SPT2 and the curved part CVT1 of the transmitter line Tx is extended in a third direction TD that is transverse to the first direction FD.

A substrate A12 is adjacent to the substrate A11. The substrate A12 of the rigid portion A1 has at least two corners, namely, a third corner CR3 and a fourth corner CR4. The first corner CR1 of the substrate A11 is opposite to and faces the third corner CR3 of the substrate A12. The corners of the substrate can also be referred to as an edge portion. Here, a second peripheral portion PHP2 of the substrate is located between the third corner CR3 and the fourth corner CR4.

The receiver line Rx includes a third straight part SPT3, a fourth straight part SPT4, and a curved part CVT2. As shown, the third straight part SPT3 of the receiver line Rx is disposed along the second peripheral portion PHP2 of the substrate between the third corner CR3 and the fourth corner CR4. The receiver line Rx further extends from the third corner CR3 and extends towards the sensing portion A3. The receiver line Rx includes a third straight part SPT3 that extends from the third corner CR3. The curved part CVT2 of the receiver line Rx is continuously and contiguously coupled to the third straight part SPT3. Similarly, the third straight part SPT3 is continuously and contiguously coupled to the fourth straight part SPT4.

Here, the third straight part SPT3 of the receiver line Rx is extended in a second direction SD (namely, the y-axis direction). The fourth straight part SPT4 and the curved part CVT2 of the receiver line Rx is extended in a fourth direction OD. The first, second, third, and fourth directions are different from each other and transverse to each other.

Figure 3:
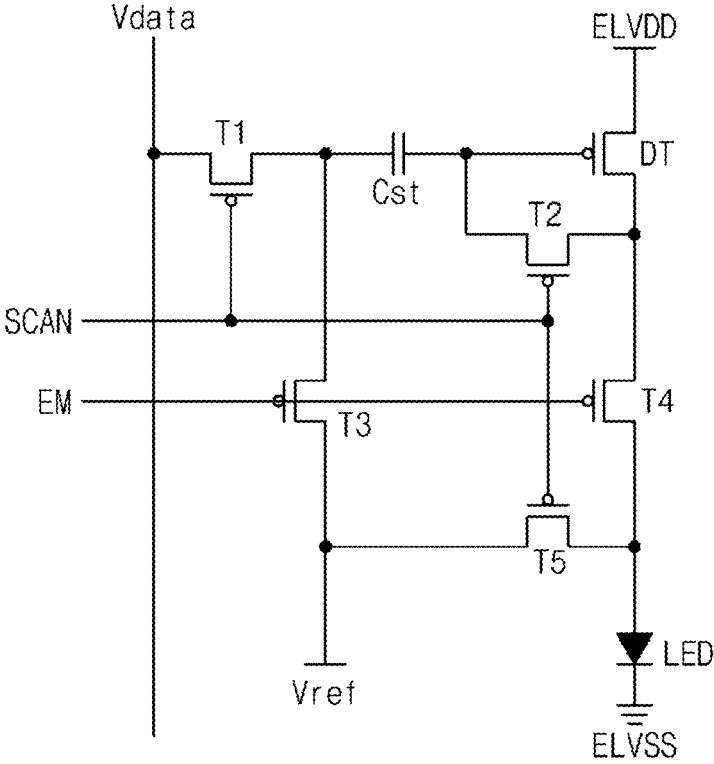
FIG. 3 is an equivalent circuit diagram for a sub-pixel of a stretchable display device according to the embodiment of the present disclosure.

FIG. 3 is an equivalent circuit diagram for a sub-pixel of a stretchable display device according to the embodiment of the present disclosure.

In FIG. 3, one sub-pixel of the stretchable display device according to the embodiment of the present disclosure, that is, each of the first, second, and third sub-pixels SP1, SP2, and SP3 of FIG. 2 may include a driving transistor DT, first, second, third, fourth, and fifth transistors T1, T2, T3, T4, and T5, a storage capacitor Cst, and a light-emitting diode LED.

For example, the driving transistor DT and the first, second, third, fourth, and fifth transistors T1, T2, T3, T4, and T5 may be P-type transistors. However, embodiments of the present disclosure are not limited thereto. In other embodiments, the driving transistor DT and the first, second, third, fourth, and fifth transistors T1, T2, T3, T4, and T5 may be N-type transistors.

The driving transistor DT may be switched according to a voltage of a first capacitor electrode of the storage capacitor Cst and may be connected to a high potential voltage ELVDD. Specifically, a gate of the driving transistor DT may be connected to the first capacitor electrode of the storage capacitor Cst and a source of the second transistor T2. A source of the driving transistor DT may be connected to the high potential voltage ELVDD. A drain of the driving transistor DT may be connected to a drain of the second transistor T2 and a source of the fourth transistor T4.

The first transistor T1 may be switched according to a gate signal SCAN and may be connected to a data signal Vdata. Specifically, a gate of the first transistor T1 may be connected to the gate signal SCAN. A source of the first transistor T1 may be connected to the data signal Vdata. A drain of the first transistor T1 may be connected to a second capacitor electrode of the storage capacitor Cst and a source of the third transistor T3.

The second transistor T2 may be switched according to the gate signal SCAN and may be connected to the driving transistor DT. Specifically, a gate of the second transistor T2 may be connected to the gate signal SCAN. The source of the second transistor T2 may be connected to the first capacitor electrode of the storage capacitor Cst and the gate of the driving transistor DT. The drain of the second transistor T2 may be connected to the drain of the driving transistor DT and the source of the fourth transistor T4.

The third transistor T3 may be switched according to an emission signal EM and may be connected to a reference voltage Vref. A gate of the third transistor T3 may be connected to the emission signal EM. The source of the third transistor T3 may be connected to the second capacitor electrode of the storage capacitor Cst and the drain of the first transistor T1. A drain of the third transistor T3 may be connected to the reference voltage Vref and a source of the fifth transistor T5.

The fourth transistor T4 may be switched according to the emission signal EM and may be connected to the driving transistor DT and the light-emitting diode LED. Specifically, a gate of the fourth transistor T4 may be connected to the emission signal EM. The source of the fourth transistor T4 may be connected to the drain of the driving transistor DT and the drain of the second transistor T2. A drain of the fourth transistor T4 may be connected to a drain of the fifth transistor T5 and a first electrode of the light-emitting diode LED.

The fifth transistor T5 may be switched according to the gate signal SCAN and may be connected to the reference voltage Vref and the fourth transistor T4. Specifically, a gate of the fifth transistor T5 may be connected to the gate signal SCAN. The source of the fifth transistor T5 may be connected to the reference voltage Vref and the drain of the third transistor T3. The drain of the fifth transistor T5 may be connected to the drain of the fourth transistor T4 and the first electrode of the light-emitting diode LED.

The storage capacitor Cst may store the data signal Vdata and a threshold voltage Vth of the driving transistor DT. The first capacitor electrode of the storage capacitor Cst may be connected to the gate of the driving transistor DT and the source of the second transistor T2. The second capacitor electrode of the storage capacitor Cst may be connected to the drain of the first transistor T1 and the source of the third transistor T3.

The light-emitting diode LED may be connected between the fourth and fifth transistors T4 and T5 and a low potential voltage ELVSS and may emit light with luminance proportional to a current of the driving transistor DT. The first electrode of the light-emitting diode LED, which is an anode, may be connected to the drain of the fourth transistor T4 and the drain of the fifth transistor T5. The second electrode of the light-emitting diode LED, which is a cathode, may be connected to the low potential voltage ELVSS.

In the embodiment of the present disclosure of FIG. 3, as an example, each sub-pixel has a 6T1C structure including six transistors and one capacitor, but in other embodiments, each sub-pixel may have one of 2T1C, 4T1C, 5T1C, 3T2C, 4T2C, 5T2C, 6T2C, 7T1C, 7T2C, 8T1C, and 8T2C structures.

A cross-sectional structure of the stretchable display device according to the embodiment of the present disclosure will be described with reference to FIGS. 4 to 7.

Figure 4:
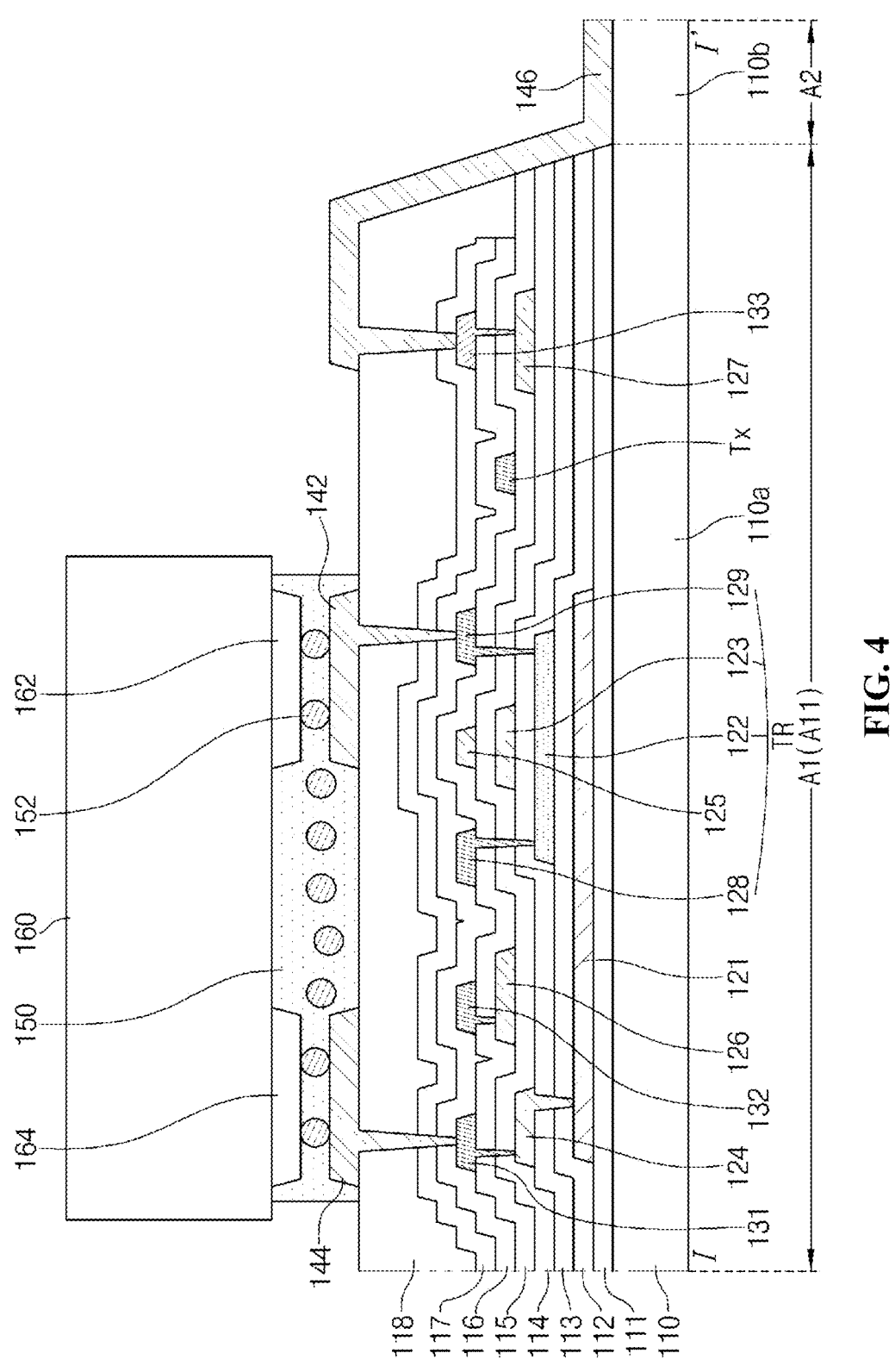
FIG. 4 is a schematic cross-sectional view corresponding to line I-I' of FIG. 2.
Figure 5:
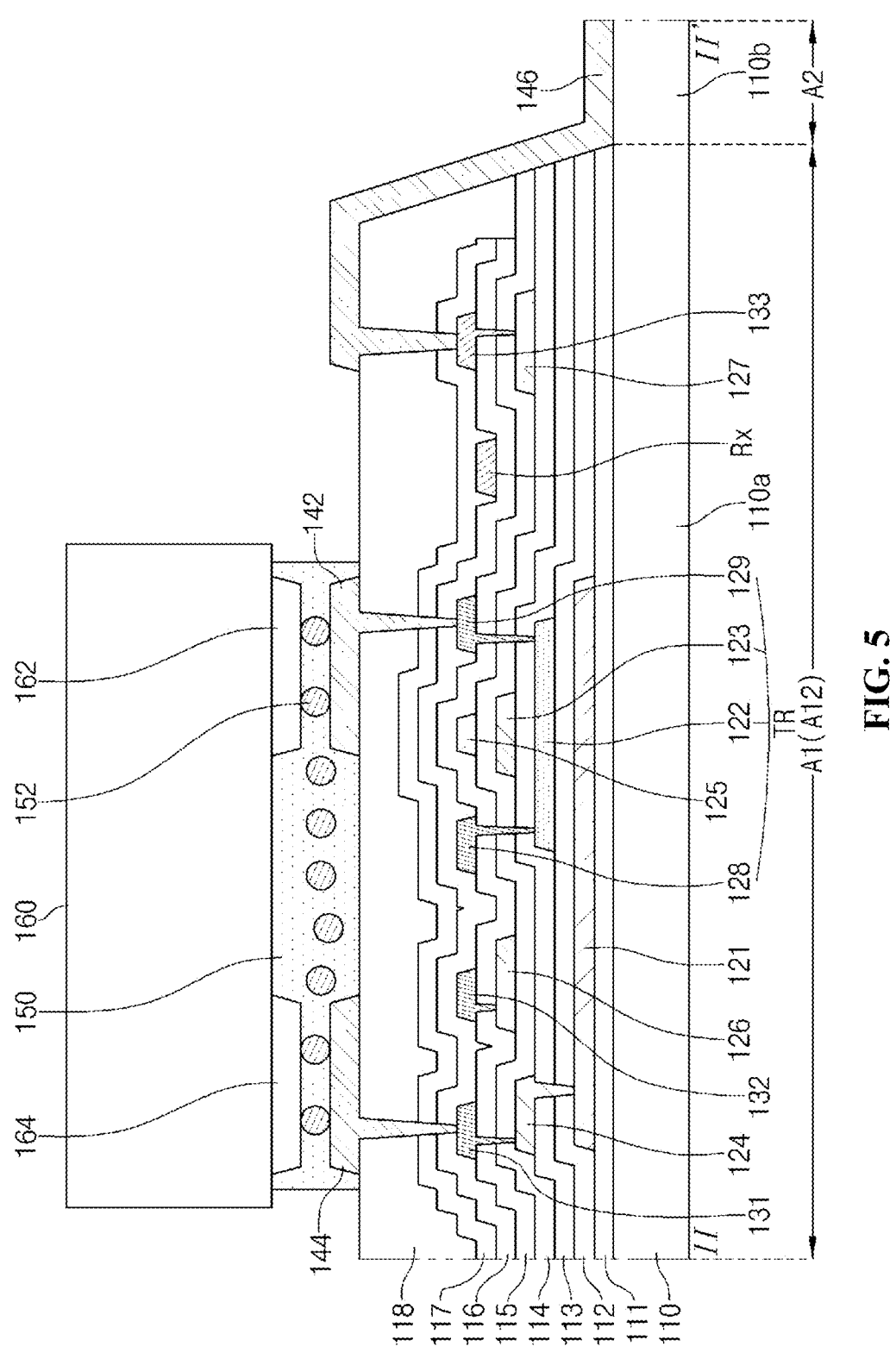
FIG. 5 is a schematic cross-sectional view corresponding to line II-II' of FIG. 2.
Figure 6:
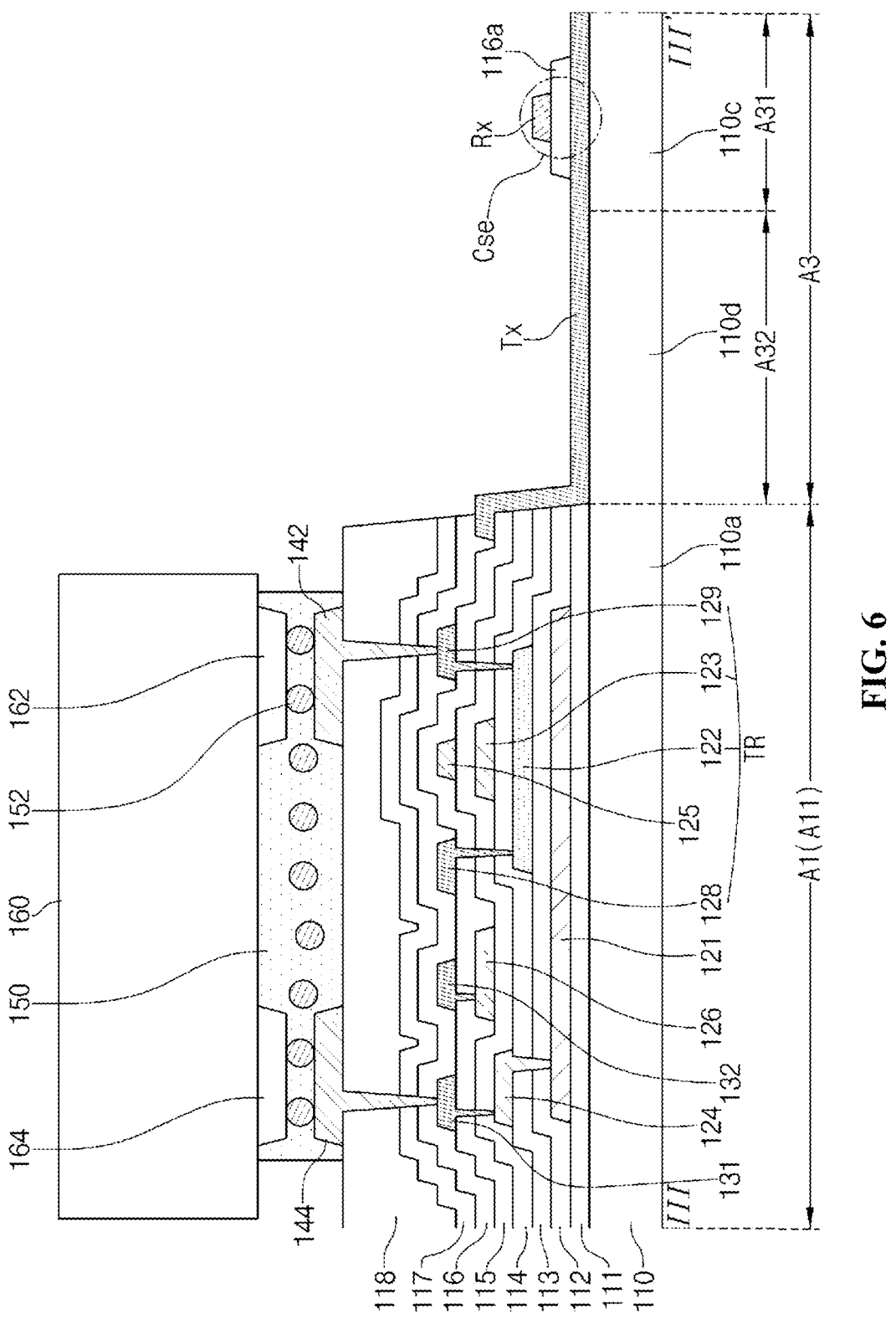
FIG. 6 is a schematic cross-sectional view corresponding to line III-III' of FIG. 2.
Figure 7:
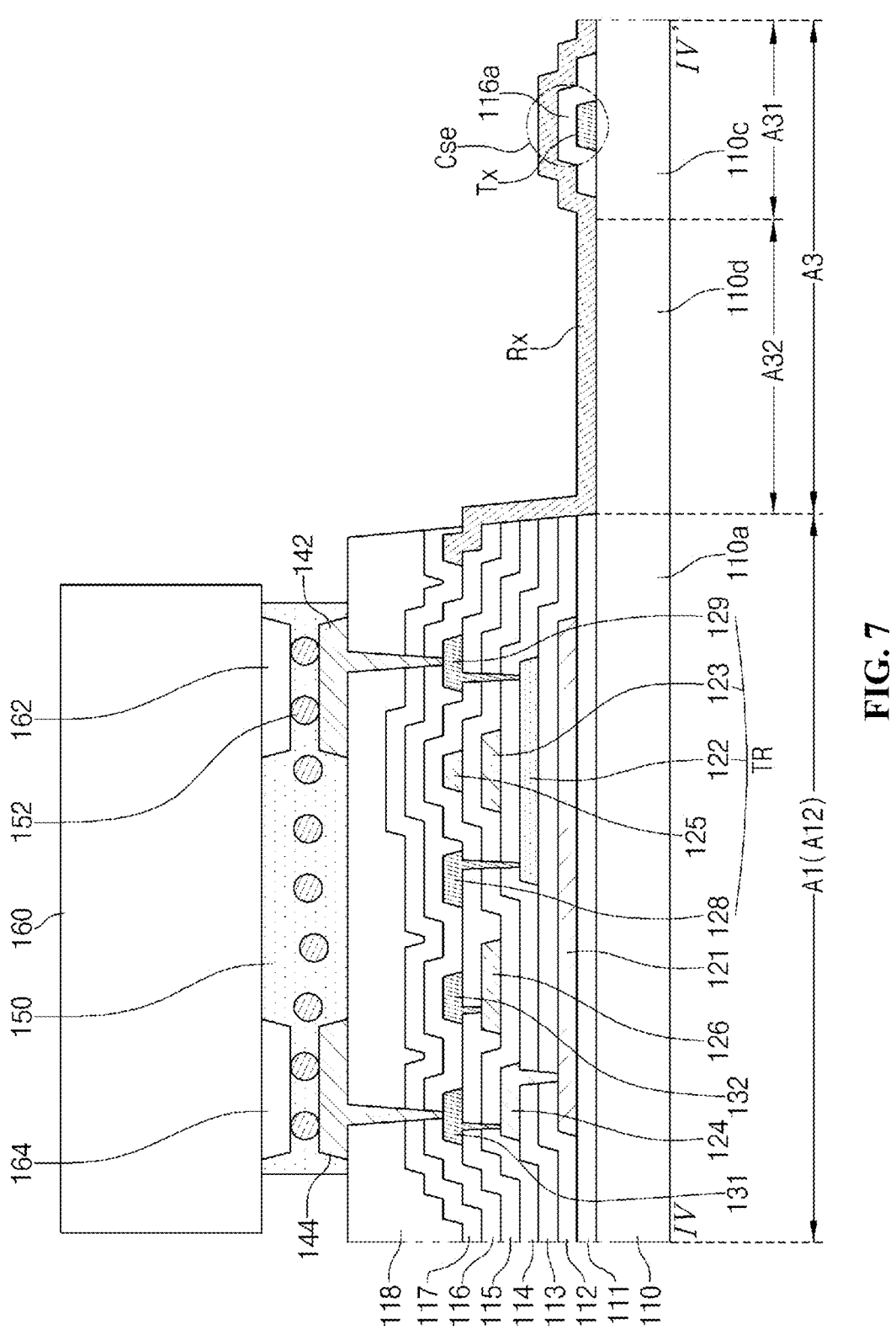
FIG. 7 is a schematic cross-sectional view corresponding to line IV-IV' of FIG. 2.

FIGS. 4 to 7 are schematic cross-sectional views of a stretchable display device according to the embodiment of the present disclosure. FIG. 4 shows a cross-section corresponding to line I-I' of FIG. 2, FIG. 5 shows a cross-section corresponding to line II-II' of FIG. 2, FIG. 6 shows a cross-section corresponding to line III-III' of FIG. 2, and FIG. 7 shows a cross-section corresponding to line IV-IV' of FIG. 2. It will be described with reference to FIGS. 1 to 3 together.

In FIGS. 4 to 7, the stretchable display device according to the embodiment of the present disclosure may include a base substrate 110 on which a rigid portion A1, a soft portion A2, and a sensing portion A3 are provided. The sensing portion A3 may include a sub rigid portion A31 and a sub soft portion A32.

The base substrate 110 may include a first base portion 110a, a second base portion 110b, a third base portion 110c, and a fourth base portion 110d. The first base portion 110a may be disposed to correspond to the rigid portion A1, the second base portion 110b may be disposed to correspond to the soft portion A2, the third base portion 110c may be disposed to correspond to the sub rigid portion A31, and the fourth base portion 110d may be disposed to correspond to the sub soft portion A32.

The first base portion 110a may be provided in a plate shape in a display area and may serve to support and protect components of a plurality of sub-pixels SP1, SP2, and SP3. The first base portion 110a may be plural, and the plurality of first base portions 110a may be spaced apart from each other in the first direction X and the second direction Y.

The second base portion 110b may be provided between the adjacent first base portions 110a in each of the first direction X and the second direction Y. The second base portion 110b may include at least one curved part and may serve to support and protect a stretchable line 146. The second base portion 110b may have substantially the same shape as the stretchable line 146.

The third and fourth base portions 110c and 110d may be provided between the adjacent second base portions 110b in the first direction X or the second direction Y. Accordingly, the third and fourth base portions 110c and 110d may be disposed between the adjacent first base portions 110a in the third direction or the fourth direction, and the fourth base portion 110d may be disposed between the first base portion 110a and the third base portion 110c.

The third base portion 110c may be provided in a plate shape and may serve to support and protect a sensing capacitor Cse. In addition, the fourth base portion 110d may include at least one curved part and may serve to support and protect a sensing line Tx and Rx. The fourth base portion 110d may have substantially the same shape as the sensing line Tx and Rx.

The first, second, third, and fourth base portions 110a, 110b, 110c, and 110d may be connected to each other and provided as one-body.

Although not shown in the figures, a first flexible substrate, which is formed of a soft matter or soft material, may be provided under the base substrate 110. The first flexible substrate may be attached to a bottom surface of the base substrate 110 through a first adhesive layer.

The base substrate 110 may be formed of a rigid material having lower flexibility than the soft material of the first flexible substrate. For example, the base substrate 110 may be formed of a polyimide (PI) resin or epoxy resin.

The base substrate 110 may have relatively high elastic modulus, and the elastic modulus of the base substrate 110 may be higher than the elastic modulus of the first flexible substrate. For example, the elastic modulus of the base substrate 110 may be more than 1,000 times higher than the elastic modulus of the first flexible substrate, but embodiments of the present disclosure are not limited thereto.

On the other hand, the first flexible substrate may be formed of a soft matter or soft material with bending or stretching properties. For example, the first flexible substrate may be formed of silicone rubber such as polydimethylsiloxane (PDMS), elastomer such as polyurethane (PU), styrene butadiene block copolymer such as styrene butadiene styrene (SBS).

The first flexible substrate may have relatively low elastic modulus, that is, Young's modulus, and may have a relatively high ductile breaking rate. Here, the elastic modulus is a value representing the rate of deformation relative to the stress applied to an object. If the elastic modulus is relatively high, the hardness may be relatively high. In addition, the ductile breaking rate refers to the elongation rate at the point when the stretched object is broken or cracked. To further elaborate, the ductile breaking rate refers to an extension distance when an object to be stretched is broken or cracked. That is, the ductile breaking rate is defined as a percentage ratio of a length of an original object and a length of the stretched object when an object has been stretched sufficiently that it is considered broken. For example, if a length of an object (e.g., a substrate) is 100 cm when the object is not stretched and then, it reaches a length of 110 cm when the object has been stretched enough that it becomes broken or cracked at this length, then it has been stretched to 110% of its original length. In this case, the ductile breaking rate of the object is 110%. The number could thus also be called a ductile breaking ratio since it is a ratio of the stretched length as the numerator compared to the original unstretched length as the denominator at the time the break occurs.

For example, the first flexible substrate may have the elastic modulus of several MPa to hundreds of MPa and the ductile breaking rate of about 100% or more. In addition, the first flexible substrate may have a thickness of about 10 μm to about 1 mm. However, embodiments of the present disclosure are not limited thereto.

In addition, the first adhesive layer may be formed of an acryl-based, silicon-based, or urethane-based adhesive. For example, the first adhesive layer may be optically clear adhesive (OCA) that is formed and attached in the form of a film or optically clear resin (OCR) that is cured after applying a liquid material.

Next, a first buffer layer 111 of a first insulation layer may be provided on the base substrate 110. The first buffer layer 111 may block permeation of moisture or oxygen from the outside to protect the components of the plurality of sub-pixels SP1, SP2, and SP3.

The first buffer layer 111 may be formed as a single layer or multiple layers of an inorganic insulating material. The inorganic insulating material of the first buffer layer 111 may include silicon nitride (SiNx), silicon oxide (SiOx), or silicon oxynitride (SiON).

In order to prevent damage of the first buffer layer 111 such as cracks due to stretching, the first buffer layer 111 may be removed in the soft portion A2 and the sensing portion A3, that is, in the soft portion A2, the sub rigid portion A31, and the sub soft portion A32, to substantially correspond to the rigid portion A1. The first buffer layer 111 may be provided over the first base portion 110a and may not be provided over the second base portion 110b, the third base portion 110c, and the fourth base portion 110d.

Alternatively, in other embodiments, the first buffer layer 111 may be omitted.

A light blocking layer 121 may be provided on the first buffer layer 111 of the rigid portion A1. The light blocking layer 121 may be formed of a conductive material such as metal. For example, the light blocking layer 121 may be formed of at least one of aluminum (Al), copper (Cu), molybdenum (Mo), titanium (Ti), chromium (Cr), nickel (Ni), tungsten (W), or an alloy thereof. The light blocking layer 121 may have a single-layered structure or a multiple-layered structure.

A second buffer layer 112 of a second insulation layer may be provided on the light blocking layer 121. The second buffer layer 112 may be formed as a single layer or multiple layers of an inorganic insulating material. The inorganic insulating material of the second buffer layer 112 may include silicon nitride (SiNx), silicon oxide (SiOx), or silicon oxynitride (SiON).

In order to prevent damage of the second buffer layer 112 such as cracks due to stretching, the second buffer layer 112 may be removed in the soft portion A2 and the sensing portion A3, that is, in the soft portion A2, the sub rigid portion A31, and the sub soft portion A32, to substantially correspond to the rigid portion A1. The second buffer layer 112 may be provided over the first base portion 110a and may not be provided over the second base portion 110b, the third base portion 110c, and the fourth base portion 110d.

A semiconductor layer 122 may be provided on the second buffer layer 112. The semiconductor layer 122 may overlap the light blocking layer 121, and the light blocking layer 121 may block light incident on the semiconductor layer 122 and prevent the semiconductor layer 122 from deteriorating due to the light.

The semiconductor layer 122 may include a channel region at its central part and source and drain regions at both sides of the channel region.

The semiconductor layer 122 may be formed of an oxide semiconductor material. Alternatively, the semiconductor layer 122 may be formed of polycrystalline silicon, and in this case, both ends of the semiconductor layer 122 may be doped with impurities.

A gate insulation layer 113 of a third insulation layer may be provided on the semiconductor layer 122. The gate insulation layer 113 may be formed as a single layer or multiple layers of an inorganic insulating material. The inorganic insulating material of the gate insulation layer 113 may include silicon nitride (SiNx), silicon oxide (SiOx), or silicon oxynitride (SiON).

In order to prevent damage of the gate insulation layer 113 such as cracks due to stretching, the gate insulation layer 113 may be removed in the soft portion A2 and the sensing portion A3, that is, in the soft portion A2, the sub rigid portion A31, and the sub soft portion A32, to substantially correspond to the rigid portion A1. The gate insulation layer 113 may be provided over the first base portion 110a and may not be provided over the second base portion 110b, the third base portion 110c, and the fourth base portion 110d.

A gate electrode 123 and a first connection electrode 124 may be provided on the gate insulation layer 113.

The gate electrode 123 may overlap the semiconductor layer 122 and may be disposed to correspond to the central part of the semiconductor layer 122. Accordingly, the gate electrode 123 may also overlap the light blocking layer 121.

The first connection electrode 124 may be spaced apart from the semiconductor layer 122 and may overlap the light blocking layer 121. The first connection electrode 124 may be in contact with the light blocking layer 121 through a contact hole provided in the second buffer layer 112 and the gate insulation layer 113.

The gate electrode 123 and the first connection electrode 124 may be formed of a conductive material such as metal. For example, the gate electrode 123 and the first connection electrode 124 may be formed of at least one of aluminum (Al), copper (Cu), molybdenum (Mo), titanium (Ti), chromium (Cr), nickel (Ni), tungsten (W), or an alloy thereof. The gate electrode 123 and the first connection electrode 124 may have a single-layered structure or a multiple-layered structure.

A first interlayer insulation layer 114 of a fourth insulation layer may be provided on the gate electrode 123 and the first connection electrode 124. The first interlayer insulation layer 114 may be formed as a single layer or multiple layers of an inorganic insulating material. The inorganic insulating material of the first interlayer insulation layer 114 may include silicon nitride (SiNx), silicon oxide (SiOx), or silicon oxynitride (SiON).

In order to prevent damage of the first interlayer insulation layer 114 such as cracks due to stretching, the first interlayer insulation layer 114 may be removed in the soft portion A2 and the sensing portion A3, that is, in the soft portion A2, the sub rigid portion A31, and the sub soft portion A32, to substantially correspond to the rigid portion A1. The first interlayer insulation layer 114 may be provided over the first base portion 110a and may not be provided over the second base portion 110b, the third base portion 110c, and the fourth base portion 110d.

An auxiliary electrode 125, an auxiliary line 126, and a pad electrode 127 may be provided on the first interlayer insulation layer 114. The auxiliary electrode 125 may overlap the gate electrode 123, the semiconductor layer 122, and the light blocking layer 121. The auxiliary line 126 may overlap the light blocking layer 121 and may be spaced apart from the gate electrode 123, the semiconductor layer 122, and the first connection electrode 124. The pad electrode 127 may be spaced apart from the light blocking layer 121 and may be disposed around an edge of the rigid portion A1 adjacent to the soft portion A2.

The auxiliary electrode 125, the auxiliary line 126, and the pad electrode 127 may be formed of a conductive material such as metal. For example, the auxiliary electrode 125, the auxiliary line 126, and the pad electrode 127 may be formed of at least one of aluminum (Al), copper (Cu), molybdenum (Mo), titanium (Ti), chromium (Cr), nickel (Ni), tungsten (W), or an alloy thereof. The auxiliary electrode 125, the auxiliary line 126, and the pad electrode 127 may have a single-layered structure or a multiple-layered structure.

A second interlayer insulation layer 115 of a fifth insulation layer may be provided on the auxiliary electrode 125, the auxiliary line 126, and the pad electrode 127. The second interlayer insulation layer 115 may be formed as a single layer or multiple layers of an inorganic insulating material. The inorganic insulating material of the second interlayer insulation layer 115 may include silicon nitride (SiNx), silicon oxide (SiOx), or silicon oxynitride (SiON).

In order to prevent damage of the second interlayer insulation layer 115 such as cracks due to stretching, the second interlayer insulation layer 115 may be removed in the soft portion A2 and the sensing portion A3, that is, in the soft portion A2, the sub rigid portion A31, and the sub soft portion A32, to substantially correspond to the rigid portion A1. The second interlayer insulation layer 115 may be provided over the first base portion 110a and may not be provided over the second base portion 110b, the third base portion 110c, and the fourth base portion 110d.

A source electrode 128, a drain electrode 129, a second connection electrode 131, and a power line 132 may be provided on the second interlayer insulation layer 115.

The source electrode 128 and the drain electrode 129 may be spaced apart from each other with the gate electrode 123 positioned therebetween and may be in contact with both ends of the semiconductor layer 122 through contact holes provided in the first and second interlayer insulation layers 114 and 115 and the gate insulation layer 113. The gate electrode 123 and the auxiliary electrode 125 may be disposed between the source electrode 128 and the drain electrode 129.

The semiconductor layer 122, the gate electrode 123, the source electrode 128, and the drain electrode 129 may constitute a thin film transistor TR.

The second connection electrode 131 may be spaced apart from the thin film transistor TR. The second connection electrode 131 may overlap the first connection electrode 124 and may be in contact with the first connection electrode 124 through a contact hole provided in the first and second interlayer insulation layers 114 and 115. In addition, the second connection electrode 131 may overlap the light blocking layer 121.

The power line 132 may be spaced apart from the thin film transistor TR. The power line 132 may overlap the auxiliary line 126 and may be in contact with the auxiliary line 126 through a contact hole formed in the second interlayer insulation layer 115.

For example, the power line 132 may be a signal line supplying the low potential voltage ELVSS. At this time, the power line 132 or the auxiliary line 126 may be connected to the light blocking layer 121. That is, the light blocking layer 121 may be supplied with the low potential voltage ELVSS.

The source electrode 128, the drain electrode 129, the second connection electrode 131, and the power line 132 may be formed of a conductive material such as metal. For example, the source electrode 128, the drain electrode 129, the second connection electrode 131, and the power line 132 may be formed of at least one of aluminum (Al), copper (Cu), molybdenum (Mo), titanium (Ti), chromium (Cr), nickel (Ni), tungsten (W), or an alloy thereof. The source electrode 128, the drain electrode 129, the second connection electrode 131, and the power line 132 may have a single-layered structure or a multiple-layered structure.

In addition, a transmitter line Tx may be provided on the second interlayer insulation layer 115. Specifically, a part of the transmitter line Tx may be disposed on the second interlayer insulation layer 115 of the rigid portion A1, and the transmitter line Tx may extend into the sensing portion A3.

In the rigid portion A1, the transmitter line Tx may be in contact with side surfaces of the first buffer layer 111, the second buffer layer 112, the gate insulation layer 113, the first interlayer insulation layer 114, and the second interlayer insulation layer 115. Further, in the sensing portion A3, the transmitter line Tx may be in contact with the third base portion 110*c* of the sub rigid portion A31 and the fourth base portion 110*d* of the sub soft portion A32.

The transmitter line Tx may be formed of the same material as the source electrode 128, the drain electrode 129, the second connection electrode 131, and the power line 132. However, embodiments of the present disclosure are not limited thereto.

Next, a third interlayer insulation layer 116 of a sixth insulation layer may be provided on the source electrode 128, the drain electrode 129, the second connection electrode 131, and the power line 132. The third interlayer insulation layer 116 may be formed as a single layer or multiple layers of an inorganic insulating material. The inorganic insulating material of the third interlayer insulation layer 116 may include silicon nitride (SiNx), silicon oxide (SiOx), or silicon oxynitride (SiON).

In order to prevent damage of the third interlayer insulation layer 116 such as cracks due to stretching, the third interlayer insulation layer 116 may be removed in the soft portion A2 to substantially correspond to the rigid portion A1. The third interlayer insulation layer 116 may be provided over the first base portion 110*a* and may not be provided over the second base portion 110*b*. In addition, the third interlayer insulation layer 116 may be partially removed in the sensing portion A3 and may not be provided over the fourth base portion 110*d* of the sub soft portion A32.

Meanwhile, a dielectric pattern 116*a* may be provided in the sub rigid portion A31 of the sensing portion A3. The dielectric pattern 116*a* may be formed of the same material as the third interlayer insulation layer 116. However, embodiments of the present disclosure are not limited thereto.

The dielectric pattern 116*a* may be spaced apart from the rigid portion A1. Accordingly, the dielectric pattern 116*a* may be spaced apart from the third interlayer insulation layer 116.

In the sub rigid portion A31, the dielectric pattern 116*a* may overlap the transmitter line Tx and may be in contact with top and side surfaces of the transmitter line Tx. Additionally, in the sub rigid portion A31, the dielectric pattern 116*a* may be in contact with the third base portion 110*c*. An area of the dielectric pattern 116*a* may be smaller than an area of the third base portion 110*c*.

Next, an auxiliary pad 133 may be provided over the third interlayer insulation layer 116. The auxiliary pad 133 may overlap the pad electrode 127 and may be in contact with the pad electrode 127 through a contact hole provided in the second and third interlayer insulation layers 115 and 116.

The auxiliary pad 133 may be formed of a conductive material such as metal. For example, the auxiliary pad 133 may be formed of at least one of aluminum (Al), copper (Cu), molybdenum (Mo), titanium (Ti), chromium (Cr), nickel (Ni), tungsten (W), or an alloy thereof. The auxiliary pad 133 may have a single-layered structure or a multiple-layered structure.

In addition, a receiver line Rx may be provided on the third interlayer insulation layer 116. Specifically, a part of the receiver line Rx may be disposed on the third interlayer insulation layer 116 of the rigid portion A1, and the receiver line Rx may extend into the sensing portion A3. The receiver line Rx may be formed of the same material as the auxiliary pad 133. However, embodiments of the present disclosure are not limited thereto.

Alternatively, in other embodiments, the receiver line Rx may be formed of the same material and on the same layer as the source electrode 128, the drain electrode 129, the second connection electrode 131, and the power line 132, and the transmitter line Tx may be formed of the same material and on the same layer as the auxiliary pad 133. In another embodiment, one of the transmitter line Tx and the receiver line Rx may be formed of the same material and on the same layer as the gate electrode 123.

In the rigid portion A1, the receiver line Rx may be in contact with side surfaces of the first buffer layer 111, the second buffer layer 112, the gate insulation layer 113, the first interlayer insulation layer 114, the second interlayer insulation layer 115, and the third interlayer insulation layer 116. Additionally, in the sensing portion A3, the receiver line Rx may be in contact with the fourth base portion 110*d* of the sub soft portion A32 and may be partially in contact with the third base portion 110*c* of the sub rigid portion A31.

In the sensing portion A3, the receiver line Rx may overlap the dielectric pattern 116*a* and may be in contact with top and side surfaces of the dielectric pattern 116*a*.

The receiver line Rx may overlap the transmitter line Tx with the dielectric pattern 116*a* interposed therebetween to form the sensing capacitor Cse.

As shown in FIG. 2 above, the transmitter line Tx and the receiver line Rx may be disposed in the respective rigid portions A1 spaced apart from each other and may not be disposed in the same rigid portion A1. The transmitter line Tx and the receiver line Rx may be spaced apart from and overlap each other with the dielectric pattern 116*a* interposed therebetween only over the sub rigid portion A31 of the sensing portion A3, thereby forming the sensing capacitor Cse.

A passivation layer 117 may be provided on the auxiliary pad 133 and the receiver line Rx. The passivation layer 117 may be formed as a single layer or multiple layers of an inorganic insulating material. The inorganic insulating material of the passivation layer 117 may include silicon nitride (SiNx), silicon oxide (SiOx), or silicon oxynitride (SiON).

In order to prevent damage of the passivation layer 117 such as cracks due to stretching, the passivation layer 117 may be removed in the soft portion A2 and the sensing portion A3, that is, in the soft portion A2, the sub rigid portion A31, and the sub soft portion A32, to substantially correspond to the rigid portion A1. The passivation layer 117 may be provided over the first base portion 110a and may not be provided over the second base portion 110b, the third base portion 110c, and the fourth base portion 110d.

At this time, edges of the passivation layer 117 and the third interlayer insulation layer 116 of the rigid portion A1 may be partially removed, thereby exposing the top surface of the second interlayer insulation layer 115.

The passivation layer 117 may be omitted.

A planarization layer 118 may be provided on the passivation layer 117. The planarization layer 118 may eliminate a step difference due to the layers thereunder and may have a substantially flat top surface. The planarization layer 118 may be formed of an organic insulating material such as photosensitive acrylic polymer (photo acryl).

The planarization layer 118 may be provided in the rigid portion A1 and may not be provided in the soft portion A2 and the sensing portion A3, that is, in the soft portion A2, the sub rigid portion A31, and the sub soft portion A32. Accordingly, the planarization layer 118 may be provided over the first base portion 110a and may not be provided over the second base portion 110b, the third base portion 110c, and the fourth base portion 110d.

In the rigid portion A1, the planarization layer 118 may be in contact with side surfaces of the third interlayer insulation layer 116 and the passivation layer 117 and may also be in contact with the exposed top surface of the second interlayer insulation layer 115.

A first electrode 142, a second electrode 144, and the stretchable line 146 may be provided on the planarization layer 118.

The first electrode 142, the second electrode 144, and the stretchable line 146 may be formed of a conductive material such as metal. For example, the first electrode 142, the second electrode 144, and the stretchable line 146 may be formed of at least one of aluminum (Al), copper (Cu), molybdenum (Mo), titanium (Ti), chromium (Cr), nickel (Ni), tungsten (W), or an alloy thereof. The first electrode 142, the second electrode 144, and the stretchable line 146 may have a single-layered structure or a multiple-layered structure.

The first electrode 142 may overlap the drain electrode 129 and may be in contact with the drain electrode 129 through a contact hole provided in the planarization layer 118, the passivation layer 117, and the third interlayer insulation layer 116. The second electrode 144 may overlap the second connection electrode 131 and may be in contact with the second connection electrode 131 through a contact hole provided in the planarization layer 118, the passivation layer 117, and the third interlayer insulation layer 116.

One end of the stretchable line 146 may be disposed on the planarization layer 118. The one end of the stretchable line 146 may overlap the auxiliary pad 133 and may be in contact with the auxiliary pad 133 through a contact hole provided in the planarization layer 118 and the passivation layer 117. At this time, the one end of the stretchable line 146 may also overlap the pad electrode 127.

The stretchable line 146 may extend into and be provided in the soft portion A2. The stretchable line 146 may be in contact with top and side surfaces of the planarization layer 118 in the rigid portion A1 and may be in contact with the top surface of the second base portion 110b in the soft portion A2. The stretchable line 146 may also be in contact with the side surfaces of the first buffer layer 111, the second buffer layer 112, the gate insulation layer 113, the first interlayer insulation layer 114, and the second interlayer insulation layer 115.

Meanwhile, although not shown in the figures, a bank layer may be further provided on the first electrode 142, the second electrode 144, and the stretchable line 146 in the rigid portion A1. The bank layer may expose at least parts of the first electrode 142 and the second electrode 144 and may cover the one end of the stretchable line 146.

Next, an adhesive layer 150 may be provided on the first and second electrodes 142 and 144 of the rigid portion A1. The adhesive layer 150 may be an anisotropic conductive film (ACF) including an insulating base member and a plurality of conductive balls 152 dispersed in the insulating base member.

When heat or pressure is applied to the adhesive layer 150, in an area where the heat or pressure is applied, the conductive balls 152 may be electrically connected, so that the adhesive layer 150 may have a conductive property, and in an area where the heat or pressure is not applied, the adhesive layer 150 may have an insulating property.

A light-emitting element 160 may be provided on the adhesive layer 150. The light-emitting element 160 may include a first element electrode 162 and a second element electrode 164.

Here, the first element electrode 162 may be a p-electrode, and the second element electrode 164 may be an n-electrode. The first element electrode 162 may be an anode, and the second element electrode 164 may be a cathode. However, embodiments of the present disclosure are not limited thereto.

Alternatively, in other embodiments, the first element electrode 162 may be an n-electrode, and the second element electrode 164 may be a p-electrode. In this case, the first element electrode 162 may be a cathode, and the second element electrode 164 may be an anode.

The light-emitting element 160 may be provided in the form of a micro light-emitting diode chip (micro LED chip or uLED chip) including the n-electrode, an n-type layer, an active layer, a p-type layer, and the p-electrode. The light-emitting element 160 may have a flip-chip structure in which the n-electrode and the p-electrode are provided on the same side (for example, a side facing the base substrate 110) and light is emitted through a side opposite to the side provided with the n-electrode and the p-electrode (for example, a side opposite to the side facing the base substrate 110).

However, embodiments of the present disclosure are not limited thereto. The light-emitting element 160 may have a lateral structure in which the n-electrode and the p-electrode are provided on the same side and light is emitted through the same side provided with the n-electrode and the p-electrode or may have a vertical structure in which the n-electrode and the p-electrode are provided on opposite sides, respectively.

The first element electrode 162 of the light-emitting element 160 may overlap the first electrode 142 from a plan view, and the second element electrode 164 of the light-emitting element 160 may overlap the second electrode 144 from a plan view. The first element electrode 162 may be electrically connected to the first electrode 142 through the conductive balls 152 of the adhesive layer 150, and the second element electrode 164 may be electrically connected to the second electrode 144 through the conductive balls 152 of the adhesive layer 150. Accordingly, the second element electrode 164 may be connected to the low potential voltage ELVSS through the second electrode 144.

Meanwhile, although not shown in the figures, a second flexible substrate, which is formed of a soft matter or soft material, may be provided over the light-emitting element 160, the stretchable line 146, the sensing capacitor Cse, the transmitter line Tx, and the receiver line Rx.

The second flexible substrate may be formed of the same as the first flexible substrate. However, embodiments of the present disclosure are not limited thereto. In other embodiments, the second flexible substrate may be formed of a different material from the first flexible substrate.

The second flexible substrate may be attached to the light-emitting element 160, the stretchable line 146, the sensing capacitor Cse, the transmitter line Tx, and the receiver line Rx through a second adhesive layer. The second adhesive layer may be formed of the same material as the first adhesive layer. However, embodiments of the present disclosure are not limited thereto. In other embodiments, the second adhesive layer may be formed of a different material from the first adhesive layer.

As described above, in the stretchable display device according to the embodiment of the present disclosure, the sensing portion A3 for detecting the touch may be provided in the display panel with the rigid portion A1 and the soft portion A2 together, and the sensing capacitor Cse may be provided in the sub rigid portion A31 that is not stretched. Accordingly, even if the display device is stretched, there is no change in capacitance between the transmitter line Tx and the receiver line Rx, so the accuracy of touch sensing can be improved. At this time, a thickness of the sub rigid portion A31 may be smaller than a thickness of the rigid portion A1 and greater than a thickness of the soft portion A2.

In addition, since the sensing capacitor Cse, the transmitter line Tx, and the receiver line Rx of the sensing portion A3 are formed together with the components provided in the rigid portion A1, it is possible to implement the stretchable display device having a relatively thin thickness and to reduce the manufacturing time and costs of the stretchable display device.

Further, the sensing portion A3 may be provided between the rigid portions A1 and between the soft portions A2, and the overall resolution may not be decreased. Since the additional touch panel is not provided over the display panel, the transmittance and visibility of the stretchable display device may be improved.

In the stretchable display device, by providing the sensing capacitor for detecting touch in the additional rigid portion that is not stretched, the accuracy of touch sensing can be improved.

Additionally, by implementing the sensing portion including the sensing capacitor in the display panel, the thickness of the stretchable display device can be decreased, and the manufacturing time and costs can be reduced. Accordingly, by improving the lifetime, the production power consumption can be reduced to achieve the low power consumption.

Moreover, the transmittance and visibility of the stretchable display device can be improved without lowering the overall resolution.

It will be apparent to those skilled in the art that various modifications and variations can be made in the display device of the present disclosure without departing from the technical idea or scope of the disclosure. Thus, it is intended that the present disclosure cover the modifications and variations of this disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A stretchable display device, comprising:
a plurality of rigid portions spaced apart from each other;
a plurality of soft portions adjacent to the plurality of rigid portions;
a plurality of stretchable lines coupled between adjacent rigid portions of the plurality of rigid portions;
a plurality of sensing portions provided at locations that do not overlap with the plurality of rigid portions from a plan view;
a pixel provided in each rigid portion of the plurality of rigid portions, the pixel including a plurality of sub-pixels;
a sensing capacitor provided in at least one sensing portion of the plurality of sensing portions; and
a sensing line coupled to the sensing capacitor,
wherein the sensing line overlaps at least one rigid portion of the plurality of rigid portions.

2. The stretchable display device of claim 1, wherein the sensing line includes
a transmitter line,
wherein a first rigid portion of the plurality of rigid portions includes an edge portion, and
wherein the transmitter line extends from the edge portion of the first rigid portion and extends to a sensing portion of the plurality of sensing portions.

3. The stretchable display device of claim 2, wherein the sensing line further includes
a receiver line,
wherein a second rigid portion of the plurality of rigid portions includes an edge portion,
wherein the second rigid portion of the plurality of rigid portions is adjacent to the first rigid portion of the plurality of rigid portions, and
wherein the receiver line extends from the edge portion of the second rigid portion and extends to the sensing portion of the plurality of sensing portions.

4. The stretchable display device of claim 3, wherein the sensing capacitor includes a first capacitor electrode, a second capacitor electrode, and an insulation layer between the first capacitor electrode and the second capacitor,
wherein the transmitter line is the first capacitor electrode of the sensing capacitor, and
wherein the receiver line is the second capacitor electrode of the sensing capacitor.

5. The stretchable display device of claim 1, wherein the transmitter line and the receiver line are disposed on different layers from each other.

6. The stretchable display device of claim 4, wherein the transmitter line and the receiver line include a wave-like shape from a plan view.

7. The stretchable display device of claim 1, wherein at least one stretchable line of the plurality of stretchable lines includes a wave-like shape from a plan view.

8. The stretchable display device of claim 6, wherein each of the plurality of sub-pixels includes a light-emitting diode, at least one transistor coupled to the light-emitting diode, the at least one transistor having a source electrode and a drain electrode, and wherein either the transmitter line or the receiver line is formed of a same material and is on a same layer as one of the electrodes of the at least one transistor.

9. The stretchable display device of claim 1, wherein the sensing line includes a transmitter line having a straight part and a curved part, wherein a first rigid portion of the plurality of rigid portions includes two corners and a peripheral portion between the two corners, wherein the straight part of the transmitter line extends along the peripheral portion of the first rigid portion, and wherein the curved part of the transmitter line extends from one corner of the two corners of the first rigid portion and extends to a sensing portion of the plurality of sensing portions.

10. The stretchable display device of claim 9, wherein the sensing line further includes a receiver line having a straight part and a curved part, wherein a second rigid portion of the plurality of rigid portions includes two corners and a peripheral portion between the two corners, wherein the second rigid portion of the plurality of rigid portions is adjacent to the first rigid portion of the plurality of rigid portions, wherein the straight part of the receiver line extends along the peripheral portion of the second rigid portion, and wherein the curved part of the receiver line extends from one corner of the two corners of the second rigid portion and extends to the sensing portion of the plurality of sensing portions.

11. The stretchable display device of claim 10, wherein the corner of the first rigid portion and the corner of the second rigid portion is opposite to and facing each other, wherein the straight part of the transmitter line extends along the peripheral portion of the first rigid portion in a first direction, wherein the straight part of the receiver line extends along the peripheral portion of the second rigid portion in a second direction, wherein the curved part of the transmitter line extends to the sensing portion of the plurality of sensing portions in a third direction, wherein the curved part of the receiver line extends to the sensing portion of the plurality of sensing portions in a fourth direction, and wherein the first, second, third, and fourth directions are different from each other.

12. The stretchable display device of claim 11, wherein the curved part of the transmitter line and the curved part of the receiver line overlap with each other from a plan view at the at sensing portion, and wherein the curved part of the transmitter line and the curved part of the receiver line constitutes electrodes of the sensing capacitor.

13. A stretchable display device, comprising:

a plurality of rigid portions spaced apart from each other in a first direction and a second direction transverse to the first direction;

a soft portion provided between adjacent rigid portions of the plurality of rigid portions in either the first direction or the second direction;

a sensing portion provided between adjacent soft portions in either the first direction or the second direction;

a pixel provided in each of the plurality of rigid portions, the pixel including a plurality of sub-pixels;

a stretchable line provided in the soft portion and coupling adjacent pixels; and a sensing capacitor and a sensing line provided in the sensing portion, wherein the sensing portion includes a sub rigid portion and a sub soft portion, and wherein the sensing capacitor is provided in the sub rigid portion, and the sensing line is provided in the sub soft portion.

14. The stretchable display device of claim 13, wherein the sensing portion is disposed between adjacent rigid portions in a third direction or a fourth direction crossing the first and second directions, and wherein the sub soft portion is disposed between the rigid portion and the sub rigid portion adjacent to each other in the third direction or the fourth direction.

15. The stretchable display device of claim 13, wherein the sensing line includes a transmitter line and a receiver line, wherein the transmitter line and the receiver line cross each other in the sub rigid portion to form the sensing capacitor, and wherein the transmitter line and the receiver line extend to be provided in different rigid portions.

16. The stretchable display device of claim 15, wherein the transmitter line includes first, second, and third transmitter parts, and the receiver line includes first, second, and third receiver parts, and wherein the second transmitter part and the second receiver part cross each other in the sub rigid portion.

17. The stretchable display device of claim 16, wherein the first transmitter part, the third transmitter part, the first receiver part, and the third receiver part are disposed in the different rigid portions.

18. The stretchable display device of claim 17, wherein the plurality of rigid portions includes first, second, third, and fourth rigid portions arranged in a 2×2 matrix form, wherein the first transmitter part is disposed in the first rigid portion of an mth row and an nth column, the third transmitter part is disposed in the fourth rigid portion of an (m+1)th row and an (n+1)th column, the first receiver part is disposed in the third rigid portion of the (m+1)th row and the nth column, and the third receiver part is disposed in the second rigid portion of the mth row and the (n+1)th column, and wherein m is a natural number, and n is a natural number.

19. The stretchable display device of claim 15, wherein each of the plurality of sub-pixels includes a light-emitting diode, at least one transistor, and at least one capacitor, and wherein one of the transmitter line and the receiver line is formed of a same material and on a same layer as source and drain electrodes of the at least one transistor.

20. A stretchable display device, comprising:

a plurality of rigid portions spaced apart from each other in a first direction and a second direction transverse to the first direction;

a soft portion provided between adjacent rigid portions of the plurality of rigid portions in the first direction or the second direction;

a sub rigid portion provided between adjacent soft portions in the first direction or the second direction;

a sub soft portion provided between the rigid portion and the sub rigid portion adjacent to each other in a third direction or a fourth direction crossing the first and second directions;

a pixel provided in each of the plurality of rigid portions and including a plurality of sub-pixels;

a stretchable line provided in the soft portion and connecting adjacent pixels;

a sensing capacitor provided in the sub rigid portion; and a sensing line provided in the sub soft portion, wherein the first, second, third, and fourth directions are different from each other.

21. The stretchable display device of claim 20, wherein the sensing line includes a transmitter line and a receiver line, and wherein the transmitter line and the receiver line overlap each other in the sub rigid portion from a plan view to form the sensing capacitor.

22. The stretchable display device of claim 21, wherein the transmitter line includes first, second, and third transmitter parts, and the receiver line includes first, second, and third receiver parts, wherein the second transmitter part and the second receiver part cross each other in the sub rigid portion, and wherein the first transmitter part, the third transmitter part, the first receiver part, and the third receiver part are disposed in the different rigid portions.

23. The stretchable display device of claim 21, wherein the transmitter line and the receiver line are not disposed in a same rigid portion.

24. The stretchable display device of claim 13, wherein the sensing line overlaps at least one rigid portion of the plurality of rigid portions.

* * * * *